(12) United States Patent
Komiyama et al.

(10) Patent No.: US 10,903,669 B2
(45) Date of Patent: Jan. 26, 2021

(54) CONTROL DEVICE AND METHOD FOR CHARGING A RECHARGEABLE BATTERY

(71) Applicant: TOYOTA MOTOR EUROPE, Brussels (BE)

(72) Inventors: Keita Komiyama, Evere (BE); Yuki Katoh, Brussels (BE)

(73) Assignee: TOYOTA MOTOR EUROPE, Brussels (BE)

( * ) Notice: Subject to any disclaimer, the term of this patent is extended or adjusted under 35 U.S.C. 154(b) by 220 days.

(21) Appl. No.: 16/070,197

(22) PCT Filed: Jan. 29, 2016

(86) PCT No.: PCT/EP2016/051987
§ 371 (c)(1),
(2) Date: Jul. 13, 2018

(87) PCT Pub. No.: WO2017/129264
PCT Pub. Date: Aug. 3, 2017

(65) Prior Publication Data
US 2019/0023145 A1    Jan. 24, 2019

(51) Int. Cl.
*H02J 7/00*    (2006.01)
*H02J 7/04*    (2006.01)
(Continued)

(52) U.S. Cl.
CPC ......... *H02J 7/0029* (2013.01); *B60L 11/1861* (2013.01); *B60L 58/10* (2019.02);
(Continued)

(58) Field of Classification Search
CPC ............ G01R 19/16542; G01R 31/392; G01R 31/3835; B60L 58/10; B60L 58/12;
(Continued)

(56) References Cited

U.S. PATENT DOCUMENTS

2010/0194398 A1* 8/2010 Kawasumi ............ H01M 10/42
324/430
2011/0309801 A1* 12/2011 Kubota ................... H02J 7/027
320/162
(Continued)

FOREIGN PATENT DOCUMENTS

EP    1 458 047 A2    9/2004
EP    2 626 763 A1    8/2013
(Continued)

OTHER PUBLICATIONS

Oct. 6, 2016 International Search Report issued in International Application PCT/EP2016/051987.
(Continued)

*Primary Examiner* — Peter D Nolan
*Assistant Examiner* — Luat T Huynh
(74) *Attorney, Agent, or Firm* — Oliff PLC (57) ABSTRACT

A control device for controlling charging of a rechargeable battery, the control device being configured to: determine the voltage of the battery during charging of the battery, stop charging, when the determined voltage exceeds a predetermined upper voltage limit, determine the voltage of the battery after stopping charging, determine the voltage difference between the predetermined upper voltage limit and the determined voltage of the battery after stopping charging, and continue charging, when the determined voltage difference exceeds a predetermined threshold. A corresponding method controls charging of a rechargeable battery.

20 Claims, 5 Drawing Sheets

(51) Int. Cl.

| | |
|---|---|
| *H01M 10/48* | (2006.01) |
| *H01M 10/42* | (2006.01) |
| *B60L 58/10* | (2019.01) |
| *G01R 31/392* | (2019.01) |
| *B60L 58/15* | (2019.01) |
| *B60L 11/18* | (2006.01) |
| *G01R 19/165* | (2006.01) |
| *G01R 31/3835* | (2019.01) |
| *G01R 31/374* | (2019.01) |

(52) U.S. Cl.
CPC ........ *B60L 58/15* (2019.02); *G01R 19/16542* (2013.01); *G01R 31/3835* (2019.01); *G01R 31/392* (2019.01); *H01M 10/42* (2013.01); *H01M 10/486* (2013.01); *H02J 7/0026* (2013.01); *H02J 7/0031* (2013.01); *H02J 7/0077* (2013.01); *H02J 7/0086* (2013.01); *H02J 7/045* (2013.01); *G01R 31/374* (2019.01); *H01M 2220/20* (2013.01); *H02J 7/0048* (2020.01); *H02J 7/0049* (2020.01); *H02J 7/00302* (2020.01); *Y02T 10/70* (2013.01)

(58) Field of Classification Search
CPC . B60L 11/1861; H01M 10/42; H01M 10/486; H02J 7/0026; H02J 7/0031; H02J 7/0077; H02J 7/0086; H02J 7/045
USPC .......................................... 701/22
See application file for complete search history.

(56) References Cited

U.S. PATENT DOCUMENTS

| | | | | |
|---|---|---|---|---|
| 2014/0163801 | A1* | 6/2014 | Sato | ...................... B60W 10/08 701/22 |
| 2017/0274784 | A1* | 9/2017 | Nagakura | ................. H02J 7/00 |

FOREIGN PATENT DOCUMENTS

| | | | | |
|---|---|---|---|---|
| EP | 2626763 A1 * | 8/2013 | ............... | H02J 7/35 |
| JP | 2000-23384 A | 1/2000 | | |
| JP | 2004-171955 A | 6/2004 | | |
| JP | 2004-282881 A | 10/2004 | | |
| JP | 2005-503651 A | 2/2005 | | |
| JP | 2011-10465 A | 1/2011 | | |
| JP | 2011-15520 A | 1/2011 | | |
| JP | 2011-99691 A | 5/2011 | | |
| JP | 2012-85380 A | 4/2012 | | |
| JP | 2013-172551 A | 9/2013 | | |
| WO | 03/026042 A1 | 3/2003 | | |
| WO | 2011/001266 A2 | 1/2011 | | |
| WO | WO-2011001266 A2 * | 1/2011 | ............. | B60L 58/15 |
| WO | 2012/043744 A1 | 4/2012 | | |

OTHER PUBLICATIONS

Aug. 27, 2019 Office Action issued in Japanese Patent Aplication No. 2018-539384.
Sep. 29, 2020 Office Action issued in Chinese Patent Application No. 201680080296.X.

* cited by examiner

CONTROL DEVICE AND METHOD FOR CHARGING A RECHARGEABLE BATTERY

FIELD OF THE DISCLOSURE

The present disclosure is related to a control device for controlling charging of a rechargeable battery and also to a method of charging of a rechargeable battery.

BACKGROUND OF THE DISCLOSURE

Rechargeable batteries, also called secondary cells, have become increasingly important as energy storages, in particular for vehicles. Such vehicles may be hybrid vehicles comprising an internal combustion engine and one or more electric motors or purely electrically driven vehicles.

A suitable rechargeable battery for such a vehicle may be a solid-state bipolar battery or other, e.g. liquid type batteries, in particular a laminated Li-ion battery. The rechargeable battery may be realized by a single cell or it may include a set of preferably identical cells. In the latter case the battery is also called a battery pack.

The battery or the battery pack may further include a control device for controlling charging and/or discharging. The control device monitors state of charge (SOC) of the battery and it shall avoid the battery from operating outside its safe operating area. Such a battery or battery pack is also called smart battery/smart battery pack. It is also possible that the control device is provided by the vehicle.

One important aspect of charge control is to assure that any overcharging and/or over-discharging of the battery is avoided. For this purpose the battery voltage may be monitored, which is increasing during charging. In case the determined battery voltage exceeds a predetermined upper voltage limit, it is recognized by the control device that the battery is fully charged and charging is stopped.

However, during the lifetime of a battery the charging and discharging procedures may lead to a degradation of the laminated layers of the battery. In particular the laminated electrodes may be affected by the degradation. The degradation leads to increased resistance which in turn increases the measured voltage of the battery during charging.

As a result, when charging a battery with lamination degradation, the measured voltage reaches the predetermined upper voltage limit sooner, and the control device erroneously recognizes that the battery is fully charged. Although the battery is actually not yet fully charged (not SOC100%), charging is finished. This means that the available amount of energy decreases due to the degradation dispersion.

EP 1 458 047 A2 discloses a charge control system for preventing overcharge of single cell layers. For this purpose one of the positive and the negative electrode active material layer of the battery is made of a changeable electrode active material, and the other is made of an unchangeable electrode active material. The changeable electrode active material is an active material having a specific characteristic based on which the charging is controlled.

However, in the above technology only limited materials can be applied to the electrode layers of the battery. Moreover, the system may not be able to compensate a large degradation.

SUMMARY OF THE DISCLOSURE

Currently, it remains desirable to provide a control device which provides a reliable charging control function and which is suitable for different battery types.

Therefore, according to embodiments of the present disclosure, a control device is provided for controlling charging of a rechargeable battery. The control device is configured to:

determine the voltage of the battery during charging of the battery, stop charging, when the determined voltage exceeds a predetermined upper voltage limit, determine the voltage of the battery after stopping charging, determine the voltage difference between the predetermined upper voltage limit comparatively and the determined voltage of the battery after stopping charging, and continue charging, when the determined voltage difference exceeds a predetermined threshold.

By providing such a configuration it is possible to control charging based on the determined voltage decrement or drop of the battery when the charging is stopped. Such a voltage drop is relatively high, in case the battery has already suffered from lamination degradation, as the degradation leads to a higher resistance and thus to a higher voltage of the battery during charging. In other words, if the voltage drop is higher than the predetermined threshold, it can be determined that the relatively high voltage of the battery during charging is due to lamination degradation and not due to an actually fully charged state of the battery. In this case the charging is continued.

The control device and the procedure performed by the control device are suitable for all types of solid-state bipolar batteries. However, the control device may also be applied to other battery types, like liquid type batteries, as e.g. Li-ion batteries.

The control device may further be configured to, when the determined voltage difference exceeds the predetermined threshold, increase the predetermined upper voltage limit by a predetermined voltage increment and restart charging of the battery, or restart charging of the battery for a limited time interval and re-determine the voltage difference after stopping charging.

In this way charging can be continued in a suitable extent by continually increasing the predetermined upper voltage limit or by continuing charging for one or more limited time periods. In case the predetermined upper voltage limit is increased by a predetermined voltage increment, a further charging cycle can be performed by restarting charging and stopping charging, when the determined voltage exceeds the incremented predetermined upper voltage limit. In case charging is continued for a limited time period, charging is stopped after that time period automatically and the voltage difference is again compared with the predetermined threshold. Accordingly, said charging for a limited time period also defines a charging cycle. In other words the procedure of the invention can be performed repeatedly in several cycles, until the battery is actually fully charged.

Preferably, the control device may be configured to set the upper voltage limit such that an overvoltage of the battery is avoided. In this regard it is noted that the predetermined upper voltage limit does normally not constitute the actually critical upper limit but is rather chosen such that a new battery without degradation is charged until the desired full charge state is reached. Therefore this predetermined upper voltage limit may be increased, e.g. by 10%, 30%, 50% or 100%, without causing any actually dangerous overvoltage.

The control device may further be configured to, when the determined voltage difference does not exceed the predetermined threshold, determine that the battery is fully charged and reset the predetermined threshold.

In other words, the control device may recognize based on the determined voltage difference, whether the battery is fully charged or charging has to be continued. As it will be described in more detail below, the predetermined threshold may be determined each time the battery is charged. Therefore the predetermined threshold may also be reset, when charging has been completed.

In particular, the control device may be configured to determine the threshold based on the state of charge of the battery before starting charging.

In other words the threshold may be determined before starting charging or when charging is started. The state of charge of the battery before charging is started may be more the lower limit of a predetermined allowed SOC range, e.g. 60%. The determined state of the charge (SOC) before starting charging may be considered when determining the threshold, as the SOC may have an influence on the determined voltage difference. The threshold namely depends on internal resistance of the battery. Also internal resistance depends on SOC of the battery. Therefore, when the SOC is low, it is preferable to increase the threshold. In other words, the lower the SOC is before starting charging, the more the threshold may be increased.

Furthermore the threshold may be determined additionally or alternatively based on a determined degradation of the battery.

The degradation of the battery may be determined based on a temperature/frequency distribution of the battery and a predetermined degradation rate of the battery.

The determination of the degradation of the battery may be based on the Arrhenius equation.

The temperature/frequency distribution of the battery may be determined by recording for each temperature of the battery how much time the battery had this temperature during its lifetime.

In other words, the temperature data of the battery may be collected during the life time of the battery, i.e. during its usage and the rests between usages. The temperature/frequency distribution may be established by accumulating for each temperature the battery had during its past life time, how long the battery had this temperature.

Preferably, the control device may comprise a voltage sensor for determining the voltage of the battery. This voltage sensor may also be used for determining the state of charge of the battery. Alternatively the control device may comprise a further voltage sensor for determining the state of charge of the battery.

The control device may comprise a temperature sensor for determining the temperature of the battery.

The disclosure further relates to a battery pack. The battery pack may comprise at least one battery, in particular a solid state bipolar battery, and a control device as described above.

The disclosure further relates to a battery charging system. Said battery charging system may comprise at least one battery, in particular a solid state bipolar battery, a charging device for the battery, and a control device as described above.

According to a further aspect the disclosure relates to a vehicle comprising an electric motor and a battery pack, as described above.

Alternatively the vehicle may comprise an electric motor, at least one battery, in particular a solid state bipolar battery, and in addition a control device, as described above.

Moreover the disclosure relates to a method of controlling charging of a rechargeable battery. The method comprises the steps of:
  determining the voltage of the battery during charging of the battery,
  stopping charging, when the determined voltage exceeds a predetermined upper voltage limit,
  determining the voltage of the battery after stopping charging,
  determining the voltage difference between the predetermined upper voltage limit and the determined voltage of the battery after stopping charging, and
  continuing charging, when the determined voltage difference exceeds a predetermined threshold.

Preferably, when the determined voltage difference exceeds the predetermined threshold, the predetermined upper voltage limit is increased by a predetermined voltage increment and charging of the battery restarted, or charging of the battery is restarted for a limited time interval and after stopping charging the voltage difference is re-determined.

The upper voltage limit may be set such that an overvoltage of the battery is avoided.

When the determined voltage difference does not exceed the predetermined threshold, it is preferably determined that the battery is fully charged and the predetermined threshold may be reset.

The threshold may be determined based on the state of charge of the battery before starting charging.

The threshold may be determined based on a determined degradation of the battery.

The degradation of the battery may be determined based on a temperature/frequency distribution of the battery and a predetermined degradation rate of the battery.

The degradation of the battery may be determined based on the determined voltage difference.

The determination of the degradation of the battery may be based on the Arrhenius equation.

The temperature/frequency distribution of the battery may be determined by recording for each temperature of the battery how much time the battery had this temperature during its lifetime.

The accompanying drawings, which are incorporated in and constitute a part of this specification, illustrate embodiments of the disclosure and together with the description, serve to explain the principles thereof.

DESCRIPTION OF THE EMBODIMENTS

Reference will now be made in detail to exemplary embodiments of the disclosure, examples of which are illustrated in the accompanying drawings. Wherever possible, the same reference numbers will be used throughout the drawings to refer to the same or like parts.

Figure 1:
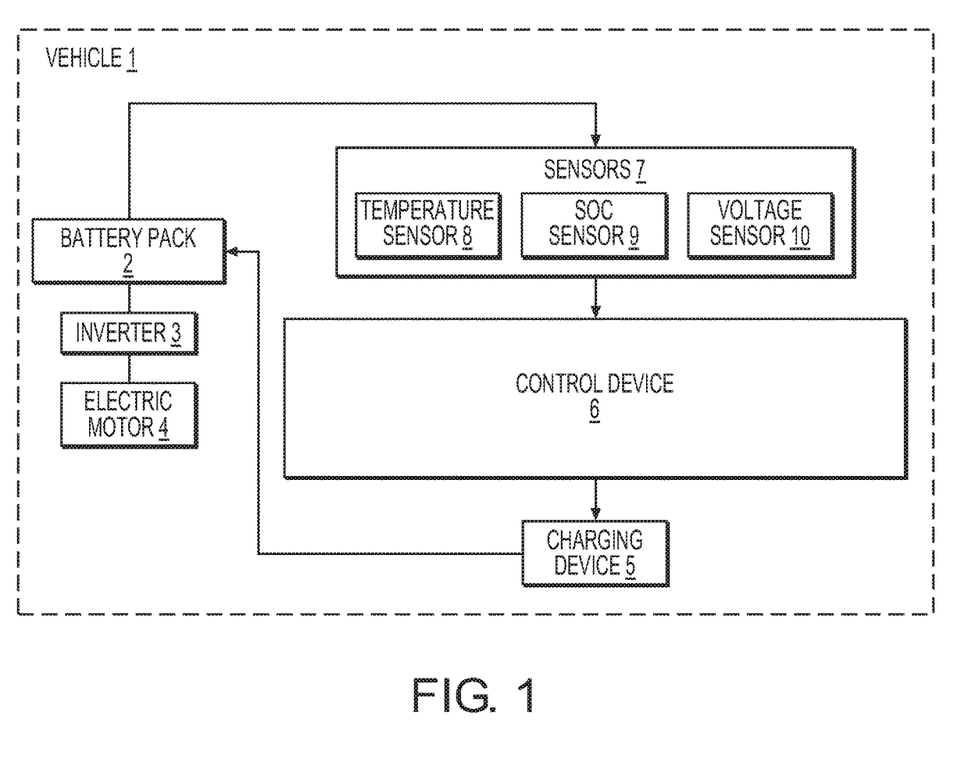
FIG. 1 shows a schematic representation of a vehicle comprising a control device according to an embodiment of the present disclosure.

FIG. 1 shows a schematic representation of a vehicle 1 comprising a control device 6 according to an embodiment of the present disclosure. The vehicle 1 may be a hybrid vehicle or an electric vehicle (i.e. a purely electrically driven vehicle). The vehicle 1 comprises at least one electric motor 4, which is powered by a battery or battery pack 2, preferably via an inverter 3. In case the vehicle is a hybrid vehicle, it further includes an internal combustion engine. The battery 2 may be a solid-state bipolar battery. However, it may also be another battery type, like a liquid type battery, as e.g. a Li-ion battery.

The battery 2 is connected to a charging device 5 which is configured to charge the battery 2. For this purpose the charging device 5 may comprise an electric control circuit, as e.g. a power electronics circuit. The charging device may further comprise or be connected to a connector for external charging by an external power source. The connector may be e.g. a plug or a wireless connector system. In case the vehicle is a hybrid vehicle, the charging device may further be connected to the electrical generator of the internal combustion engine of the vehicle. Consequently, the battery 2 may be charged, when the internal combustion engine is operating and/or when the vehicle is connected to an external power source. Furthermore the battery 2 may be discharged, in order to operate the vehicle 1, in particular the electric motor 4. The battery 2 may further be discharged in a battery treatment and/or recovery procedure.

In order to control charging and discharging the vehicle 2 is provided with the control device 6 and sensors 7. For this purpose the control device 6 monitors the battery 2 via the sensors 7 and controls the charging device 5. The control device 6 and/or the sensors 7 may also be comprised by the battery 2. The control device may be an electronic control circuit (ECU). It may also comprise a data storage. It is also possible that the vehicle comprises a smart battery charging system with a smart battery and a smart charging device. In other words, both the battery and the vehicle may comprise each an ECU which operate together and form together the control device according to the invention. Furthermore the control device 6 may comprise or may be part of a battery management system.

The control device 6 may comprise an application specific integrated circuit (ASIC), an electronic circuit, a processor (shared, dedicated, or group), a combinational logic circuit, a memory that executes one or more software programs, and/or other suitable components that provide the described functionality of the control device 6.

The sensors 7 may comprise one or more temperature sensors 8 for measuring the temperature of the battery 2, an SOC (state of charge) sensor 9 for measuring the state of charge of the battery 2 and a voltage sensor 10 for measuring the voltage of the battery. The SOC sensor 9 may also be a voltage sensor, wherein the measured voltage is used to determine the SOC of the battery. In this case the SOC sensor may be the same sensor as the voltage sensor 10 or it may be an additional sensor. Of course, the SOC sensor 9 may also comprise other sensor types to determine the SOC of the battery, as it is well known in the art.

Figure 2:
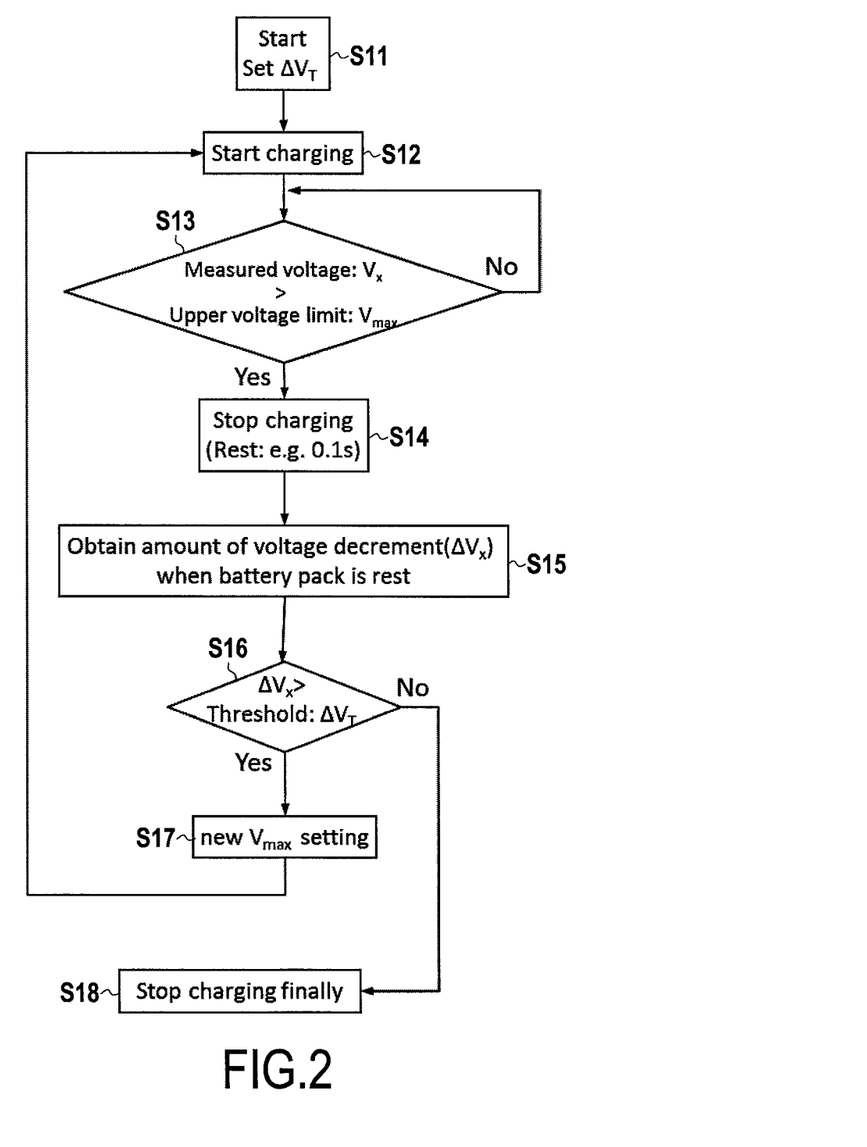
FIG. 2 shows a flow chart of the general charging control procedure according to an embodiment of the present disclosure.

FIG. 2 shows a flow chart of the general charging control procedure according to an embodiment of the present disclosure. The control device 6 is configured to carry out this procedure of FIG. 2.

In step S11 the procedure is started. The start may be triggered by a determination of the control device that charging of the battery is necessary (e.g. due to a low SOC) and/or by the fact that charging becomes possible (e.g. due to operation of the internal combustion engine or due to a connection to an external electrical power source). Moreover in step S11 the threshold $\Delta V_T$ may be determined. This determination procedure is described in detail in the following, in particular in context of FIGS. 3 and 4.

In step S12 charging of the battery is started.

In step S13 the voltage $V_x$ of the battery is measured, preferably during charging. Hence, the voltage $V_x$ is monitored, preferably continuously. It is then determined, whether the measured voltage $V_x$ of the battery exceeds a predetermined upper voltage limit $V_{max}$. If it does not, charging is continued. However, if the measured voltage $V_x$ of the battery exceeds the predetermined upper voltage limit $V_{max}$, the method continues with step S14. Accordingly, the voltage $V_x$ of the battery continuously increases during charging and charging is stopped, when $V_x$ exceeds $V_{max}$.

Said upper voltage limit $V_{max}$ is preferably dependant on the battery type and is determined by pre-experiment. The control device may receive respective information from the battery, e.g. directly the value of $V_{max}$ of the battery or any ID of the battery. In the latter case the control device may look up in a data storage the battery specific value of $V_{max}$ based on the received ID. It is noted that $V_{max}$ and $V_x$ are preferably absolute (i.e. positive) values.

In step S14 charging is stopped at least for a limited time, as e.g. maximally 0.02 s, 0.05 s, 0.1 s or 0.2 s. Preferably also discharging may be stopped for this time. In a conventional charging control procedure charging would be finally stopped in step S14, even if the battery was actually not fully charged.

In step S15 the voltage $V_x$ of the battery is measured again, however now in the state that charging (and eventually even discharging) is stopped due to the charging interruption started in S14. Then the voltage difference $\Delta V_x$ between the predetermined upper voltage limit and the voltage $V_x$ measured in step S15 after stopping charging is determined. Since the voltage $V_x$ measured in step S15 is regularly lower than that one measured during charging in step S13, $\Delta V_x$ is a voltage decrement.

Alternatively the voltage difference $\Delta V_x$ may also be the difference between the voltage $V_x$ measured in step S13 directly before stopping charging and the voltage $V_x$ measured in step S15 after stopping charging.

This voltage decrement is at least partially due to a lamination degradation of the battery, as the degradation leads to a higher resistance and thus to a higher voltage of the battery during charging. It can be consequently determined that, if the voltage decrement is relatively high, there is lamination degradation which has caused the measured voltage during charging in step S13 to exceed the upper voltage limit $V_{max}$.

In step S16 it is determined, whether the determined voltage difference $\Delta V_x$ exceeds the predetermined threshold $\Delta V_T$. In case it does not, it is determined that charging is completed and hence charging is stopped finally in step S18 However, in case $\Delta V_x$ exceeds $\Delta V_T$, The procedure continues with step S17. It is noted that $\Delta V_x$ and $\Delta V_T$ are preferably absolute (i.e. positive) values.

In step S17 a new value is set as upper voltage limit $V_{max}$. In particular, the upper voltage limit $V_{max}$ may be increased by a predetermined increment, e.g. by 0.1V, 0.2V, 0.5V, 1V or 2V. Then the procedure returns to step S12 and charging is restarted. Preferably, the upper voltage limit $V_{max}$ is reset to its initial value, when charging is stopped finally in step S18.

In this way the cycle of the control procedure from step S12 to S17 can be repeated several times, in particular as long as $\Delta V_x$ exceeds $\Delta V_T$. In other words, the charging procedure is controlled primarily based on the comparison of $\Delta V_x$ with $\Delta V_T$. The comparison of $V_x$ with $V_{max}$ is merely used to trigger the comparison of $\Delta V_x$ with $\Delta V_T$. With each cycle $V_{max}$ may be increased, in order to allow a higher voltage $V_x$ during charging. In this way the SOC of the battery will be increased and $\Delta V_x$ regularly becomes smaller. When the battery just starts charging in step S11, $\Delta V_x$ is usually higher than $\Delta V_T$ if the battery has already suffered from lamination degradation. But in case that the voltage $V_x$ is increased (and therefore SOC is increased), $V_x$ becomes a smaller value because $\Delta V_x$ depends on the internal resistance of the battery. Also internal resistance depends on SOC, i.e. when SOC is increasing, the internal resistance is decreasing. Accordingly, with increasing SOC, $\Delta V_x$ regularly decreases until it does not exceed $\Delta V_T$ any more. Then charging is stopped finally in step S18.

Alternatively to a new setting of $V_{max}$ in step S17 the procedure may also directly restart charging for a predetermined time interval, and subsequently move to step S14. In other words, if $\Delta V_x$ exceeds $\Delta V_T$ in step S16, the battery may be charged for a limited predetermined time interval, as e.g. 5 s, 10 s or 30 s, and charging may then be stopped after this time interval in step S14, where the procedure continues with steps S15 and S16.

Figure 3:
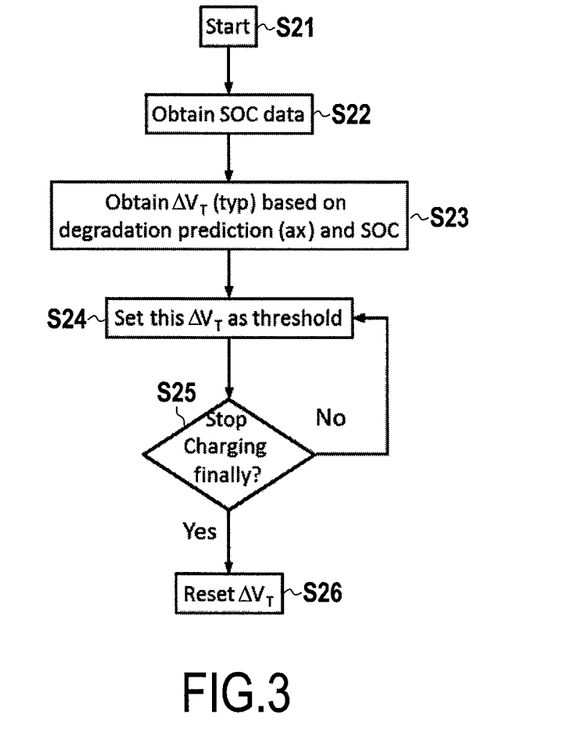
FIG. 3 shows a flow chart of the procedure for determining a threshold according to an embodiment of the present disclosure.

FIG. 3 shows a flow chart of the procedure for determining a threshold $\Delta V_T$ according to an embodiment of the present disclosure.

The procedure of FIG. 3 is preferably started together with the procedure of FIG. 2 and more preferably its steps S21 to S24 are carried out in step S11 of the procedure of FIG. 2.

In step S22 SOC (state of charge) data of the battery are determined. For this purpose the SOC sensor 9 may be used, as described above.

In step S23 the threshold $\Delta V_T$ is determined based on the determined SOC and the currently determined degradation $\alpha_x$ of the battery. The determination of $\alpha_x$ is described in detail below in context of FIG. 4. In step S24 the determined threshold $\Delta V_T$ is set as threshold, as used in step S16 of FIG. 2.

In step S25 it is monitored whether charging has been stopped finally, what corresponds to step S18 in FIG. 2. If this is the case, the threshold $\Delta V_T$ is reset in step S26. Accordingly, at each charging procedure (which may comprise several cycles of the procedure of FIG. 2) the threshold $\Delta V_T$ is set once in the beginning. Consequently for a subsequent charging procedure the threshold $\Delta V_T$ is newly determined, so that the current degradation $\alpha_x$ of the battery and the current SOC can be considered, when the subsequent charging procedure is started.

Figure 4:
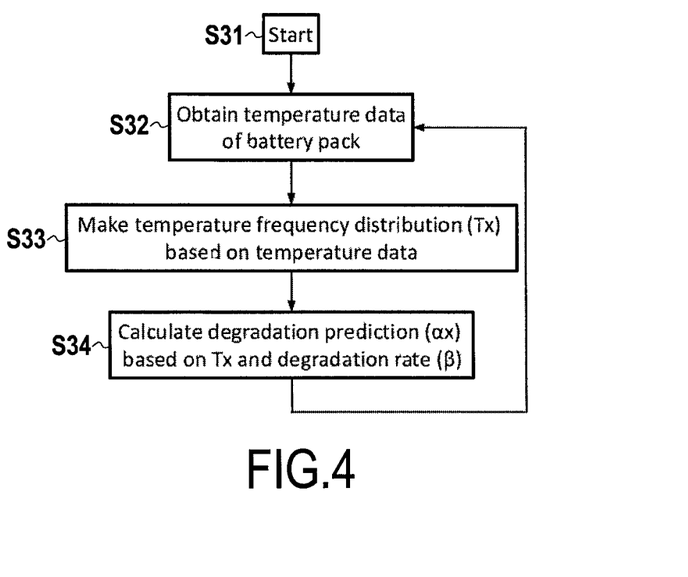
FIG. 4 shows a flow chart of the procedure for determining the degradation of a battery according to an embodiment of the present disclosure.

FIG. 4 shows a flow chart of the procedure for determining the degradation $\alpha_x$ of a battery according to an embodiment of the present disclosure. This procedure is preferably carried out in or before step S23 of FIG. 3, so that the threshold $\Delta V_T$ is always determined based on a currently updated degradation $\alpha_x$. In this context it is also noted that the determined degradation $\alpha_x$ rather represents an estimation of the actual degradation of the battery.

In step S32 temperature data of battery are obtained. For this purpose the temperature sensor 8 may be used. However, these data may include not only the current temperature of the battery, but also historic temperature data since the last time the procedure of FIG. 4 has been carried out, in particular since the last time the temperature frequency distribution $T_x$ has been updated (cf. step S33).

In step S33 the temperature frequency distribution $T_x$ is established or, in case a temperature frequency distribution $T_x$ already exists, it is updated. For this purpose the collected temperature data obtained in step S32 are accumulated, wherein the accumulated time for each measured temperature is expressed as its inverse, i.e. as frequency. The temperature frequency distribution $T_x$ is described in more detail below in context of FIG. 6.

In step S34 the degradation $\alpha_x$ of the battery is determined based on the temperature frequency distribution $T_x$ and the predetermined battery-type specific degradation rate $\beta$. This determination, i.e. calculation, is described in the following with reference to FIGS. 5 and 6.

Basically the calculation of the degradation $\alpha_x$ is based on the Arrhenius equation, as generally known in the art. The degradation $\alpha_x$ is calculated by $$\alpha x = c \times \exp\left(\frac{b}{T}\right) \times t$$

wherein:
t=time
c=ln(A)
b=−(E/R)
T=Temperature

The current degradation $\alpha_x$ is thereby an accumulated value, i.e. the currently calculated degradation and the sum of all formerly calculated degradations, as e.g.:

$$\alpha x1 = \alpha_1 + \alpha_2 + \alpha_3$$

with:

$$\alpha_1 = c \times \exp\left(\frac{b}{T_1}\right) \times t_1$$

Figure 6:
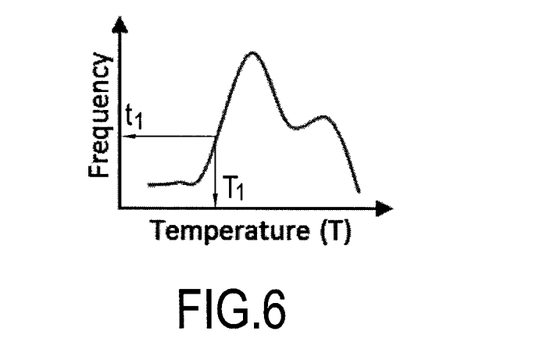
FIG. 6 shows an exemplary and schematic diagram of a determined temperature/frequency distribution of a battery.

The values for the temperature T and for the time t can thereby be derived from the temperature frequency distribution $T_x$ as shown in FIG. 6. The further parameters c and b are predetermined in context of the determination of the degradation rate $\beta$.

Figure 5:
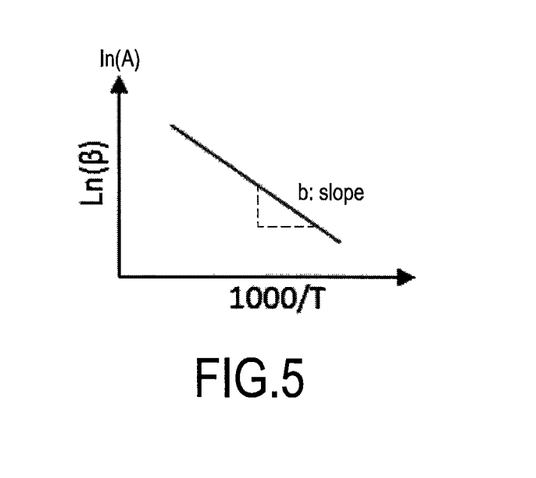
FIG. 5 shows an exemplary and schematic diagram of a predetermined degradation rate in relation to the temperature of a battery.

The degradation rate $\beta$ is calculated based on the equation:

$$k = A\exp\left(-\frac{E_a}{RT}\right)$$

wherein:
k=predetermined reaction rate constant (or rate constant)
A=constant
$E_a$=activation energy R=gas constant
T=Temperature
The parameters k, A, Ea and R are known by pre-experiment of the specific battery type of the used battery or are generally known parameters.
When k⇒β:

$$\ln(\beta) = \ln(A) - \left(\frac{E}{R}\right) \times \frac{1}{T}$$

Accordingly, the parameters b and c for the calculation of degradation $\alpha_x$ can be determined by:

$$b = -(E/R)$$

$$c = \ln(A)$$

The resulting diagram of the degradation rate β is shown in FIG. 5. The degradation rate β is predetermined and specific for the battery-type of the used battery. The degradation rate β is preferably determined in pre-experiment and is known by the battery (in case of a smart battery) and/or by the control device.

The threshold $\Delta V_T$ is preferably mapped to the determined degradation $\alpha_x$ in a look-up map, i.e.:

$$\alpha_{x1} \Rightarrow \Delta V_{T1}$$

$$\alpha_{x2} \Rightarrow \Delta V_{T2}$$

$$\alpha_{x3} \Rightarrow \Delta V_{T3}$$

etc.

This relation between $\Delta V_T$ and ax is preferably determined in a pre-experiment and is specific for the battery-type of the used battery. The look-up map may be stored in a data storage of the control-device or of the battery (in case of a smart battery).

Preferably also the determined SOC of the battery is considered when determining $\Delta V_T$. The control device may also have information regarding the relationship between SOC and $\Delta V_T$ such as in the above-mentioned look-up map of ax. For example in said look-up map an additional column for SOC values may be added.

FIG. 5 shows an exemplary and schematic diagram of a predetermined degradation rate in relation to the temperature of a battery. As it can be seen the values of the parameters b and c can be directly derived from this diagram, as b is the slope of the linear function and c is the intercept of the (elongated) linear function with the Y-axis.

FIG. 6 shows an exemplary and schematic diagram of a determined temperature/frequency distribution of a battery. In the diagram the x-axis represents the temperature T of the battery and the y-axis represents the frequency, i.e. the inverse of the time. The diagram contains the accumulated temperature data of the battery over its whole life time, i.e. over the whole time the battery has been used and the rest times between the usages. In order to establish the diagram, i.e. the illustrated curve, it is determined for each temperature the battery had during its life time, e.g. from −40° C. to +60° C. in (quantized) steps of 1° C., how much time the battery had each of these temperatures. The accumulated time is thereby expressed by its inverse, i.e. by a frequency.

Figure 7:
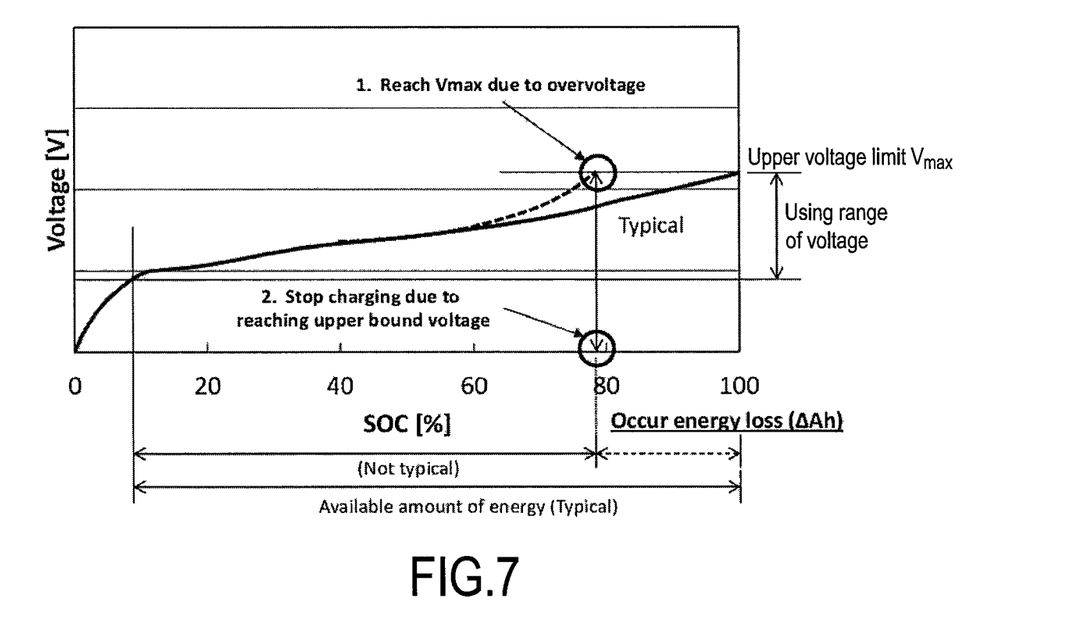
FIG. 7 shows an exemplary and schematic voltage-SOC diagram of a battery, when a conventional charging control is applied.

FIG. 7 shows an exemplary and schematic voltage-SOC diagram of a battery, when a conventional charging control is applied. As it can be seen the voltage $V_x$ of the battery increases during charging, i.e. it increases with an increasing SOC of the battery.

The continuous line thereby represents a battery without any degradation, e.g. a new battery. The measured voltage $V_x$ of such a battery reaches during charging the upper voltage limit $V_{max}$, when the SOC reaches 100%. As an effect, it is correctly determined that charging is completed and charging is stopped.

The dashed line represents a battery with lamination degradation, e.g. a used battery. The measured voltage $V_x$ of such a battery increases more strongly during charging due to the higher resistance caused by the lamination degradation. The voltage $V_x$ therefore reaches already the upper voltage limit $V_{max}$, when the SOC is about 80%. As an effect, it is erroneously determined that charging is completed and charging is stopped. This can be avoided by the invention as described in context of FIG. 8.

Figure 8:
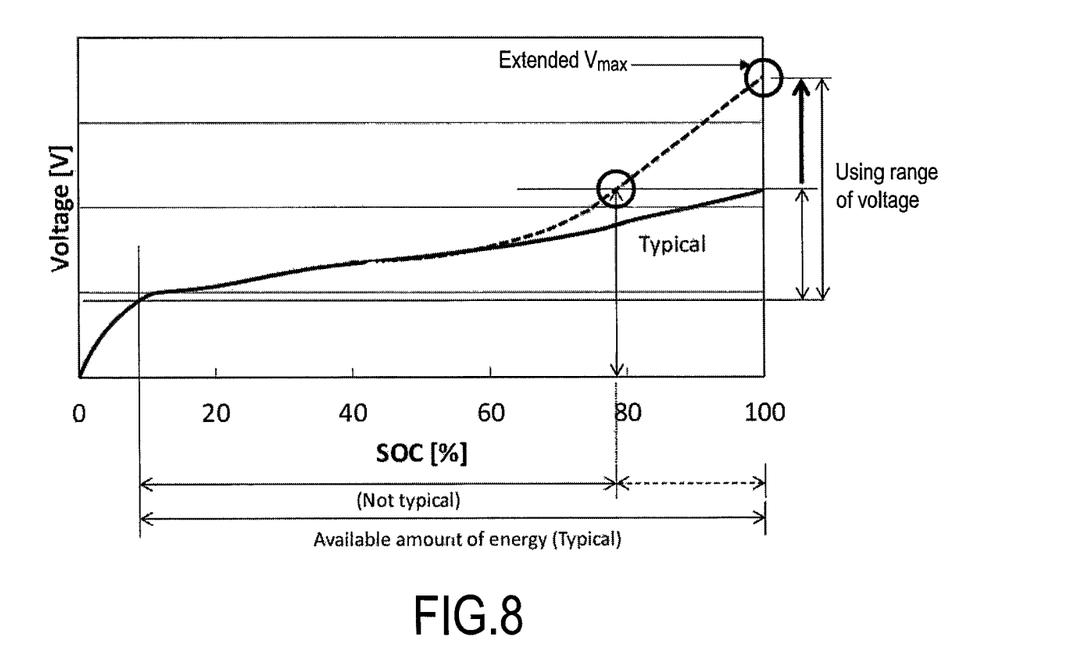
FIG. 8 shows an exemplary and schematic voltage-SOC diagram of a battery, when a charging control according to an embodiment of the present disclosure is applied.

FIG. 8 shows an exemplary and schematic voltage-SOC diagram of a battery, when a charging control according to an embodiment of the present disclosure is applied. FIG. 8 illustrates the same case as FIG. 7, i.e. a (new) battery without any degradation and a (used) battery having a lamination degradation. Both curves increase until they reach the initial upper voltage limit $V_{max}$. The dashed line representing a battery with lamination degradation thereby reaches the initial upper voltage limit $V_{max}$, when the SOC is about 80%.

However, before stopping charging completely, it is determined whether the voltage difference $\Delta V_x$ exceeds a predetermined threshold $\Delta V_T$, as described above in context of step S16 of FIG. 2. In case a lamination degradation has been recognized by determining that $\Delta V_x$ exceeds $\Delta V_T$, the upper voltage limit $V_{max}$ is increased and charging is continued. By repeating this procedure, until $\Delta V_x$ does not exceed any more the threshold $\Delta V_T$, charging can be continued until the battery has a SOC of 100%. Of course, the extended upper voltage limit $V_{max}$ should still be limited such that any actually dangerous overvoltage can be avoided.

Throughout the disclosure, including the claims, the term "comprising a" should be understood as being synonymous with "comprising at least one" unless otherwise stated. In addition, any range set forth in the description, including the claims should be understood as including its end value(s) unless otherwise stated. Specific values for described elements should be understood to be within accepted manufacturing or industry tolerances known to one of skill in the art, and any use of the terms "substantially" and/or "approximately" and/or "generally" should be understood to mean falling within such accepted tolerances.

Where any standards of national, international, or other standards body are referenced (e.g., ISO, etc.), such references are intended to refer to the standard as defined by the national or international standards body as of the priority date of the present specification. Any subsequent substantive changes to such standards are not intended to modify the scope and/or definitions of the present disclosure and/or claims.

Although the present disclosure herein has been described with reference to particular embodiments, it is to be understood that these embodiments are merely illustrative of the principles and applications of the present disclosure.

It is intended that the specification and examples be considered as exemplary only, with a true scope of the disclosure being indicated by the following claims.

The invention claimed is:

1. A control device for controlling charging of a rechargeable battery, the control device being configured to:

determine a voltage of the rechargeable battery during charging of the rechargeable battery;

stop charging, when the determined voltage exceeds a predetermined upper voltage limit;

determine the voltage of the rechargeable battery after stopping charging;

determine a voltage difference between the predetermined upper voltage limit and the determined voltage of the rechargeable battery after stopping charging;

determine a threshold based on a state of charge of the rechargeable battery before starting charging; and continue charging, when the determined voltage difference exceeds the determined threshold.

2. The control device according to claim 1, further configured to:

when the determined voltage difference exceeds the determined threshold:

increase the predetermined upper voltage limit by a predetermined voltage increment and restart charging of the rechargeable battery; or restart charging of the rechargeable battery for a limited time interval and re-determine the voltage difference after stopping charging.

3. The control device according to claim 1, further configured to:

when the determined voltage difference does not exceed the determined threshold, determine that the rechargeable battery is fully charged and reset the determined threshold.

4. The control device according to claim 1, further configured to:

determine the threshold based on a determined degradation of the rechargeable battery.

5. The control device according to claim 4, further configured to:

determine the degradation of the rechargeable battery based on a temperature/frequency distribution of the rechargeable battery and a predetermined degradation rate of the rechargeable battery.

6. The control device according to claim 5, further configured to:

determine the temperature/frequency distribution of the rechargeable battery based on recording for each temperature of the rechargeable battery how much time the rechargeable battery had that temperature during its lifetime.

7. The control device according to claim 4, wherein the determination of the degradation of the rechargeable battery is based on the Arrhenius equation.

8. The control device according to claim 1, further comprising:

a voltage sensor configured to determine the voltage of the rechargeable battery.

9. The control device according to claim 1, further comprising:

a temperature sensor configured to determine a temperature of the rechargeable battery.

10. A battery pack comprising:

a solid state bipolar battery that is the rechargeable battery; and the control device according to claim 1.

11. A battery charging system comprising:

a solid state bipolar battery that is the rechargeable battery;

a charging device for the rechargeable battery; and the control device according to claim 1.

12. A vehicle comprising:

an electric motor; and the battery pack according to claim 10.

13. A vehicle comprising:

an electric motor, a solid state bipolar battery that is the rechargeable battery; and the control device according to claim 1.

14. A method of controlling charging of a rechargeable battery, comprising:

determining a voltage of the rechargeable battery during charging of the rechargeable battery;

stopping charging, when the determined voltage exceeds a predetermined upper voltage limit;

determining the voltage of the rechargeable battery after stopping charging;

determining a voltage difference between the predetermined upper voltage limit and the determined voltage of the rechargeable battery after stopping charging;

determining a threshold based on a state of charge of the rechargeable battery before starting charging; and continuing charging, when the determined voltage difference exceeds the determined threshold.

15. The method according to claim 14, further comprising:

when the determined voltage difference exceeds the determined threshold:

increasing the predetermined upper voltage limit by a predetermined voltage increment and restarting charging of the rechargeable battery; or restarting charging of the rechargeable battery for a limited time interval and re-determining the voltage difference after stopping charging.

16. The method according to claim 14, further comprising:

when the determined voltage difference does not exceed the determined threshold, determining that the rechargeable battery is fully charged and resetting the determined threshold.

17. The method according to claim 14, wherein the threshold is determined based on a determined degradation of the rechargeable battery.

18. The method according to claim 17, wherein the degradation of the rechargeable battery is determined based on a temperature/frequency distribution of the rechargeable battery and a predetermined degradation rate of the rechargeable battery.

19. The method according to claim 18, wherein the temperature/frequency distribution of the rechargeable battery is determined based on recording for each temperature of the rechargeable battery how much time the rechargeable battery had that temperature during its lifetime.

20. The method according to claim 17, wherein the determination of the degradation of the rechargeable battery is based on the Arrhenius equation.

* * * * *